(12) United States Patent
Huang

(10) Patent No.: US 7,825,722 B2
(45) Date of Patent: *Nov. 2, 2010

(54) HIGH PASS FILTER CHIP

(75) Inventor: Tsong-Chi Huang, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/549,994

(22) Filed: Aug. 28, 2009

(65) Prior Publication Data

US 2010/0073089 A1    Mar. 25, 2010

(30) Foreign Application Priority Data

Sep. 22, 2008    (TW) .............................. 97136300 A

(51) Int. Cl.
*H03K 5/00*    (2006.01)
(52) U.S. Cl. ...................................... 327/559; 327/552
(58) Field of Classification Search ......... 327/551–559, 327/337
See application file for complete search history.

(56) References Cited

U.S. PATENT DOCUMENTS 4,074,205 A * 2/1978 Robe .......................... 330/257
2009/0295476 A1* 12/2009 Huang ......................... 330/252

* cited by examiner

*Primary Examiner*—Dinh T. Le
(74) *Attorney, Agent, or Firm*—Muncy, Geissler, Olds & Lowe, PLLC

(57) ABSTRACT

A high pass filter chip with a large size capacitor is disclosed. The high pass filter chip includes a fully-differential sensing device circuit. The fully differential sensing device circuit includes a first amplifier circuit, a second amplifier circuit, and a miller capacitor module including a third amplifier. The first amplifier circuit includes a first transistor and a second transistor, in which the base of the first transistor is coupled to the base of the second transistor. The second amplifier circuit includes a third transistor and a fourth transistor, in which the base of the third transistor is coupled to the base of the fourth transistor. A first input terminal of the third amplifier is coupled to the base of the second transistor of the first amplifier circuit, and a second terminal of the amplifier is coupled to the base of the third transistor of the second amplifier circuit.

8 Claims, 2 Drawing Sheets

US 7,825,722 B2

HIGH PASS FILTER CHIP

CROSS REFERENCE TO RELATED APPLICATIONS

This Application claims priority of Taiwan Patent Application No. 097136300, filed on Sep. 22, 2008, the entirety of which is incorporated by reference herein.

BACKGROUND OF THE INVENTION

1. Field of the Invention

The invention relates to a fully-differential sensing device circuit, and more particularly to a fully-differential sensing device circuit for a high pass filter.

2. Description of the Related Art

The conventional high pass filter usually includes two variable gain amplifier circuits and a large size capacitor is used to be coupled between the variable gain amplifier circuits to implement a high pass filtering function.

FIG. 1 shows a conventional high pass filter. As shown in FIG. 1, the high pass filter 1 includes a first variable gain amplifier circuit 11 and a second variable gain amplifier circuit 12. A large size capacitor 13 is coupled between the first variable gain amplifier circuit 11 and the second variable gain amplifier circuit 12 to perform charge/discharge and implement the filtering function of the high pass filer 1.

Since the large size capacitor 13 must be charged and discharged with a large current, further reducing the size of the large capacitor 13 is difficult. Thus, the large size capacitor can not be integrated with the first and second variable gain amplifier circuits 11 and 12 on the same chip, which increases the volume of the high pass filter and raises costs. Thus, a circuit which can further reduce the volume of the large capacitor is highly required.

BRIEF SUMMARY OF THE INVENTION

A high pass filter chip is provided. An exemplary embodiment of a high pass filter chip with a capacitor includes a fully-differential sensing device circuit. The fully-differential sensing device circuit includes a first amplifier circuit, a second amplifier circuit and a miller capacitor module. The first amplifier circuit includes a first transistor and a second transistor. A base of the first transistor is coupled to a base of the second transistor. The second amplifier circuit includes a third transistor and a fourth transistor. A base of the third transistor is coupled to a base of the fourth transistor. The miller capacitor module is coupled between the first amplifier circuit and the second amplifier circuit, which includes a third amplifier. A first input terminal of the third amplifier is coupled to the base of the second transistor, and a second input terminal of the third amplifier is coupled to the base of the third transistor.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
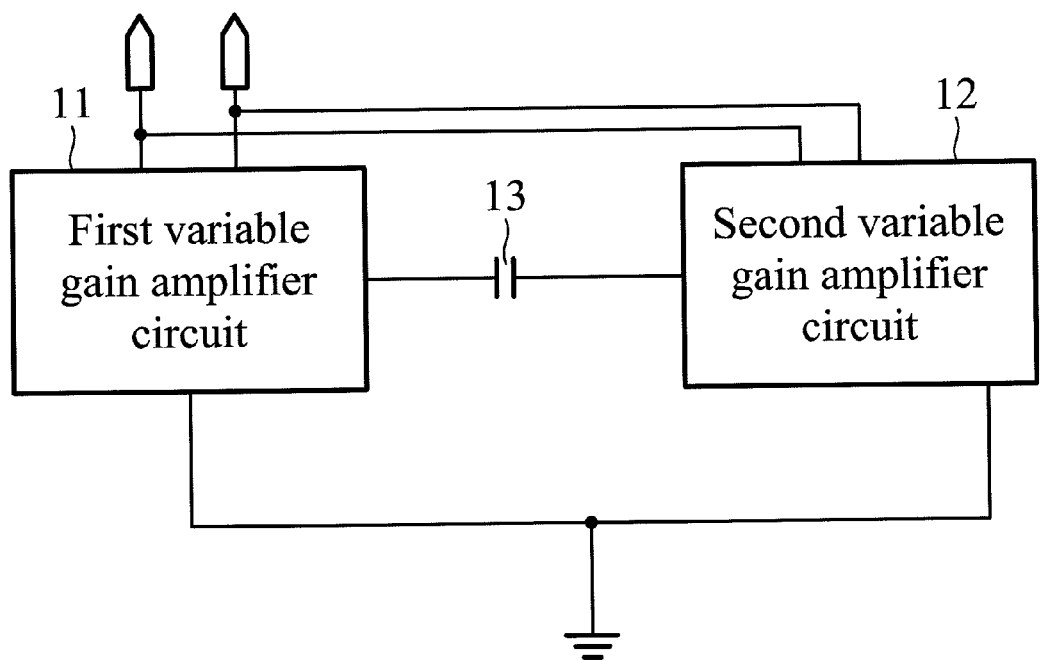
FIG. 1 shows a conventional high pass filter.
Figure 2:
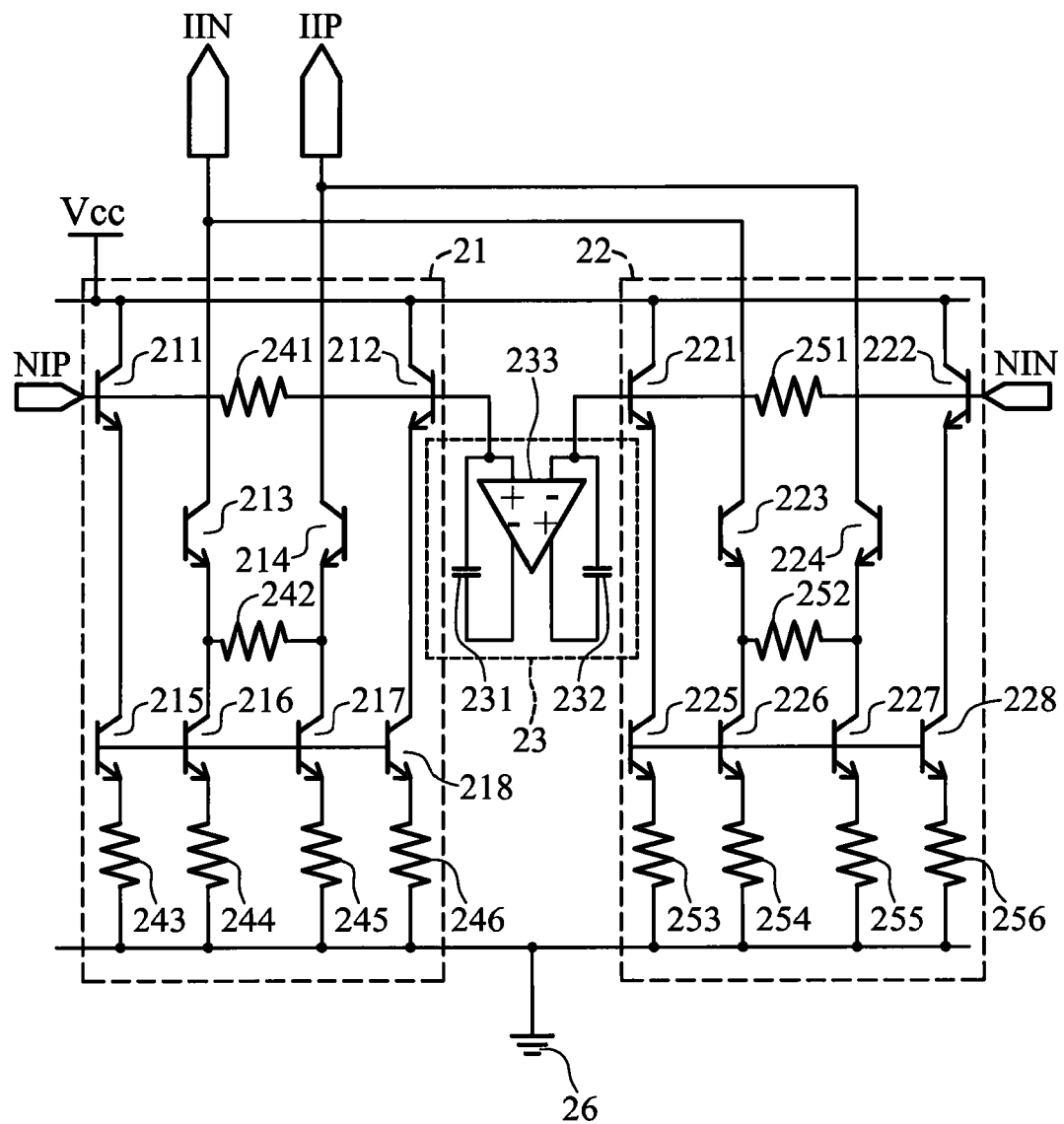
FIG. 2 shows the circuit of a high pass filter chip according to an embodiment of the invention.

FIG. 2 shows the circuit of a high pass filter chip with a capacitor according to an embodiment of the invention. As shown in FIG. 2, the fully differential sensing circuit 2 comprises a first amplifier circuit 21, a second amplifier circuit 22, a miller capacitor module 23 and a ground 26. A first terminal of the miller capacitor module 23 is coupled to the first amplifier circuit 21, and a second terminal of the miller capacitor module 23 is coupled to the second amplifier circuit 22.

The first amplifier circuit comprises a first transistor 211, a second transistor 212, a fifth transistor 213, a sixth transistor 214, a ninth transistor 215, a tenth transistor 216, an eleventh transistor 217 and a twelfth transistor 218, and further comprises a first resistor 241, a third resistor 242, a fifth resistor 243, a sixth resistor 244, a seventh resistor 245 and an eighth resistor 246.

A collector of the first transistor 211 is coupled to the voltage source Vcc and a base of the first transistor 211 is coupled to a first terminal of the first resistor 241. A collector of the second transistor 212 is coupled to the voltage source Vcc and a base of the second transistor 212 is coupled to a second terminal of the first resistor 241. A collector of the fifth transistor 213 is coupled to a negative current source IIN and a base of the fifth transistor 213 is coupled to an emitter of the first transistor 211. A collector of the sixth transistor 214 is coupled to a positive current source IIP and a base of the sixth transistor 214 is coupled to an emitter of the second transistor 212. A first terminal of the third resistor 242 is coupled to an emitter of the fifth transistor 213 and a second terminal of the third resistor 242 is coupled to an emitter of the sixth transistor 214.

A collector of the ninth transistor 215 is coupled to an emitter of the first transistor 211 and an emitter of the ninth transistor 215 is coupled to a first terminal of the fifth resistor 243. A collector of the tenth transistor 216 is coupled to the emitter of the fifth transistor 213 and an emitter of the tenth transistor 216 is coupled to a first terminal of the sixth resistor 244. A collector of the eleventh transistor 217 is coupled to the emitter of the sixth transistor 214 and an emitter of the eleventh transistor 217 is coupled to a first terminal of the seventh resistor 245. A collector of the twelfth transistor 218 is coupled to the emitter of the second transistor 212 and an emitter of the twelfth transistor 218 is coupled to a first terminal of the eighth resistor 246. The bases of the ninth, the tenth, the eleventh and the twelfth transistors 215, 216, 217, and 218 are coupled to each other and the second terminals of the fifth, the sixth, the seventh and the eighth resistors 243, 244, 245, 246 are coupled to the ground 26.

The second amplifier circuit 22 comprises a third transistor 221, a fourth transistor 222, a seventh transistor 223, an eighth transistor 224, a thirteenth transistor 225, a fourteenth transistor 226, a fifteenth transistor 227 and a sixteenth transistor 228, and further comprises a second resistor 251, a fourth resistor 252, a ninth resistor 253, a tenth resistor 254, an eleventh resistor 255 and an twelfth resistor 256.

A collector of the third transistor 221 is coupled to the voltage source Vcc and a base of the third transistor 221 is coupled to a first terminal of the second resistor 251. A collector of the fourth transistor 222 is coupled to the voltage source Vcc and a base of the fourth transistor 222 is coupled to a second terminal of the second resistor 251. A collector of the seventh transistor 223 is coupled to a negative current source IIN and a base of the seventh transistor 223 is coupled to an emitter of the third transistor 221. A collector of the eighth transistor 224 is coupled to a positive current source IIP and a base of the eighth transistor 224 is coupled to an emitter of the fourth transistor 222. A first terminal of the fourth resistor 252 is coupled to an emitter of the seventh transistor 223 and a second terminal of the fourth resistor 252 is coupled to an emitter of the eighth transistor 224.

A collector of the thirteenth transistor 225 is coupled to an emitter of the third transistor 221 and an emitter of the thirteenth transistor 225 is coupled to a first terminal of the ninth resistor 253. A collector of the fourteenth transistor 226 is coupled to the emitter of the seventh transistor 223 and an emitter of the fourteenth transistor 226 is coupled to a first terminal of the tenth resistor 254. A collector of the fifteenth transistor 227 is coupled to the emitter of the eighth transistor 224 and an emitter of the fifteenth transistor 227 is coupled to a first terminal of the tenth resistor 255. A collector of the sixteenth transistor 228 is coupled to the emitter of the fourth transistor 222 and an emitter of the sixteenth transistor 228 is coupled to a first terminal of the twelfth resistor 256. The bases of the thirteenth, the fourteenth, the fifteenth and the sixteenth transistors 225, 226, 227, the 228 are coupled to each other and the second terminals of the ninth, the tenth, the eleventh and the twelfth resistors 253, 254, 255, the 256 are coupled to the ground 26.

The miller capacitor module 23 comprises a first capacitor 231, a second capacitor 232 and a third amplifier 233. The first capacitor 231 is coupled to the non-negative terminal of the third amplifier 233 and a positive signal input source NIP. The second capacitor 232 is coupled to the negative terminal of the third amplifier 233 and a negative signal input source NIN. Since the amplifier third 233 is a fully-differential device, there is a common mode feedback circuit adopted inside thereof. The output voltage is at a specific voltage level, and thus, the charge of the capacitor does not start from zero. In this manner, the time required for charging and discharging is saved.

The first amplifier circuit 21 and the second amplifier circuit 22 of the fully differential sensing circuit 2 process signals of the positive signal input source NIP and the negative signal input source NIN. The first amplifier circuit 21 and the second amplifier circuit 22 may both be the variable gain amplifier and the miller capacitor module 23, coupled between the two variable gain amplifiers, high pass filters the signals. According to the connection between the amplifier 233, and the first capacitor 231 and the second capacitor 232, and the equation for calculating the capacitance, the expected capacitance Cext of the miller capacitor is about the gain factor of the amplifier 233 multiplied by the capacitance Cp of the first capacitor 231 and the second capacitor 232. Thus, a capacitor with a smaller size may be used instead of the large capacitor to further reduce the volume of the high pass filter and further reduce costs. Additionally, volume and costs are further reduced by integrating the capacitor and the amplifier circuitry in the same chip.

While the invention has been described by way of example and in terms of preferred embodiment, it is to be understood that the invention is not limited thereto. the who are skilled in this technology can still make various alterations and modifications without departing from the scope and spirit of this invention. Therefore, the scope of the present invention shall be defined and protected by the following claims and their equivalents.

What is claimed is:

1. A high pass filter chip with a fully-differential sensing device circuit, wherein the fully-differential sensing device circuit comprising:

a first amplifier circuit including a first transistor and a second transistor, wherein a base of the first transistor is coupled to a base of the second transistor, and a positive signal input source is coupled to the base of the first transistor;

a second amplifier circuit including a third transistor and a fourth transistor, wherein a base of the third transistor is coupled to a base of the fourth transistor, and a negative signal input source is coupled to the base of the fourth transistor; and a miller capacitor module coupled between the first amplifier circuit and the second amplifier circuit, which includes a third amplifier, wherein a first input terminal of the third amplifier is coupled to the base of the second transistor, and a second input terminal of the third amplifier is coupled to the base of the third transistor; wherein a first signal output of the fully-differential sensing device circuit is coupled to a first output terminal of the third amplifier and a second signal output of the fully-differential sensing device circuit is coupled to the second output terminal of the third amplifier.

2. The high pass filter chip as claimed in claim 1, wherein the base of the first transistor of the first amplifier circuit is coupled to a first terminal of a first resistor, and the second transistor is coupled to a second terminal of the first resistor.

3. The high pass filter chip as claimed in claim 1, wherein the base of the third transistor of the second amplifier circuit is coupled to a first terminal of a second resistor, and the fourth transistor is coupled to a second terminal of the second resistor.

4. The high pass filter chip as claimed in claim 1, wherein the first amplifier circuit further comprises a fifth transistor and a sixth transistor, and wherein an emitter of the fifth transistor is coupled to a first terminal of a third resistor, and an emitter of the sixth transistor is coupled to a second terminal of the third resistor.

5. The high pass filter chip as claimed in claim 1, wherein the second amplifier circuit further comprises a seventh transistor and an eighth transistor, and wherein an emitter of the seventh transistor is coupled to a first terminal of a fourth resistor, and an emitter of the eighth transistor is coupled to a second terminal of the fourth resistor.

6. The high pass filter chip as claimed in claim 1, wherein the first amplifier circuit further comprises a ninth transistor, a tenth transistor, an eleventh transistor, and a twelfth transistor, and wherein a base of the ninth transistor, a base of the tenth transistor, a base of the eleventh transistor and a base of the twelfth transistor are coupled to each other; wherein the ninth transistor is coupled to the first transistor, the tenth transistor is coupled to the fifth transistor, the eleventh transistor is coupled to the sixth transistor, and the twelfth transistor is coupled to the second transistor.

7. The high pass filter chip as claimed in claim 1, wherein the second amplifier circuit further comprises a thirteenth transistor, a fourteenth transistor, a fifteenth transistor, and a sixteenth transistor, and wherein a base of the thirteenth transistor, a base of the fourteenth transistor, a base of the fifteenth transistor and a base of the sixteenth transistor are coupled to each other; wherein the thirteenth transistor is coupled to the third transistor, the fourteenth transistor is coupled to the seventh transistor, the fifteenth transistor is coupled to the eighth transistor and the sixteenth transistor is coupled to the fourth transistor.

8. The high pass filter chip as claimed in claim 1, wherein the miller capacitor module further comprises a first capacitor and a second capacitor, and wherein the first capacitor is coupled between a first output terminal and the first input terminal of the third amplifier, and the second capacitor is coupled between a second output terminal and the second input terminal of the amplifier.

* * * * *